United States Patent

Miki et al.

[15] 3,688,200

[45] Aug. 29, 1972

[54] AUTOMATIC CLOCK PULSE FREQUENCY SWITCHING SYSTEM

[72] Inventors: Ryoji Miki, Hadano; Kouzo Kayashima, Isehara; Tsuneo Uraki, Hadano, all of Japan

[73] Assignee: Hitachi, Ltd., Tokyo, Japan

[22] Filed: April 27, 1971

[21] Appl. No.: 137,776

[30] Foreign Application Priority Data

May 4, 1970 Japan ......................45/37517

[52] U.S. Cl. ........................328/62, 328/63, 328/75, 328/103

[51] Int. Cl. ............................H03k 1/16, H03k 1/18

[58] Field of Search..............328/62, 63, 72, 75, 103

[56] References Cited

UNITED STATES PATENTS

| | | | |
|---|---|---|---|
| 2,781,446 | 2/1957 | Eckert, Jr. et al. | ......328/62 X |
| 3,290,606 | 12/1966 | Rodner | .........................328/62 |
| 3,325,741 | 6/1967 | Arya | ............................328/62 |

*Primary Examiner*—John Zazworksy
*Attorney*—Craig, Antonelli & Hill

[57] ABSTRACT

An automatic clock pulse frequency switching system capable of switching a plurality of clock pulse oscillation modes without temporarily interrupting the clock pulse supply and without causing any disturbance of the waveform of the subsequent clock pulse oscillation. It comprises an oscillator having a plurality of delay lines and capable of providing a plurality of different oscillation modes, a gate circuit connected to the output side of said oscillator for selecting one of said oscillation modes of said oscillator, said gate circuit providing an inverse output coupled through a loop circuit back to the input side of said oscillator, and a clock pulse frequency section connected to the output side of said gate circuit, said frequency switching section providing a switching command for the switching of oscillation modes to said gate circuit in accordance with external instructions given in a synchronous relation to the prevailing clock pulse oscillation, said switching command being delivered during part of the prevailing clock pulse waveform available from said gate circuit during which said prevailing waveform is insignificant to said circuit.

6 Claims, 13 Drawing Figures

INVENTORS

RYOJI MIKI,
KOUZO KAYASHIMA AND
TSUNEO URAKI

BY

ATTORNEYS

INVENTORS
RYOJI MIKI,
KOUZO KAYASHIMA AND
TSUNEO URAKI
BY Craig, Antonelli & Hill
ATTORNEYS

INVENTORS

RYOJI MIKI,
KOUZO KAYASHIMA AND
TSUNEO URAKI

BY Craig, Antonelli & Hill
ATTORNEYS

INVENTORS
RYOJI MIKI,
KOUZO KAYASHIMA AND
TSUNEO URAKI

BY Craig, Antonelli & Hill
ATTORNEYS

AUTOMATIC CLOCK PULSE FREQUENCY SWITCHING SYSTEM

BACKGROUND OF THE INVENTION

1. Field of the Invention

This invention relates to automatic clock pulse frequency switching systems and, more particularly, to automatic clock pulse frequency switching systems capable of switching a plurality of clock pulse oscillation modes without temporarily interrupting the clock pulse supply and without causing any disturbance of the subsequent clock pulse waveform.

2. Description of the Prior Art

The automatic clock pulse frequency switching system has various advantages. It enables a quick and automatic confirmation of the redundancy of an operation cycle with the clock pulse frequency as a parameter. This system also provides means to automatically perform the preventive maintenance during the operation of the computer. Further, it enables ready observation of the waveforms involved in the operation of high-speed computers by effectively reducing the clock pulse frequency.

Usual automatic clock pulse frequency switching systems comprise a plurality of oscillators oscillating at different frequencies and a clock pulse frequency control section, which section functions to ensure reliable operation even when the clock pulse supply is stopped. At the time of switching clock pulse frequencies, the clock pulse supply is stopped to these computer sections, (mainly the logical circuitry of the central processing unit) which require for their operations clock pulses. Then the switching of clock pulse frequencies is carried out in accordance with the instruction from the clock pulse frequency control section. The operation of these sections are resumed when the supply of new clock pulses is started.

These prior-art systems, however, require a plurality of oscillators and a clock pulse frequency control unit stably operating even when the oscillator operation is stopped. Therefore, the entire circuit is subject to severe overload. Also, the supply of the clock pulses should be stopped at the time of the clock pulse frequency switching.

SUMMARY OF THE INVENTION

An object of the invention is to provide an automatic clock pulse frequency switching system, which is inexpensive and capable of reliably switching clock pulse frequencies according to frequency switching instructions given in a synchronous relation to the prevailing clock pulse frequency without temporarily interrupting the clock pulse supply and without causing any disturbance of the subsequent clock pulse oscillation.

According to the invention, a single oscillator is used, which is provided with a plurality of delay lines to suit the required number of clock pulse frequencies and a loop circuit for the feedback of its inverse output, so that the selected clock pulse frequency is fed back through the loop to thereby achieve the automatic switching of the clock pulse frequencies.

DESCRIPTION OF THE PREFERRED EMBODIMENT

Figure 1:
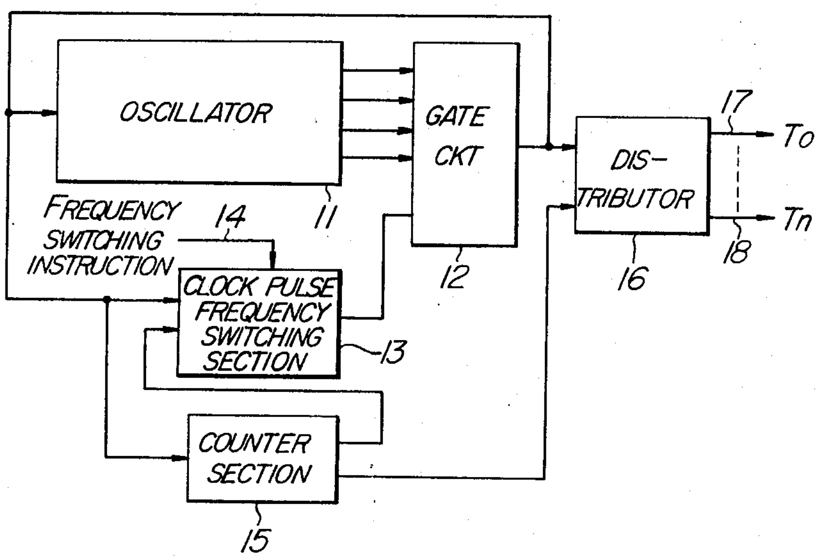
FIG. 1 is a block diagram of one embodiment of the automatic clock pulse frequency switching system according to the invention.

FIG. 1 shows an embodiment of the invention. Reference numeral 11 designates an oscillator, which comprises a plurality of delay lines and is capable of providing a plurality of oscillation modes. The individual oscillation modes are coupled to a gate circuit 12, which switches them in accordance with the frequency switching command from a clock pulse frequency switching section 13. An inverse output of the gate circuit 12 is fed back through a loop circuit to the oscillator 11. The output of the gate circuit 12 is delivered to the external circuitry. It is also fed to the clock pulse frequency switching section 13. The section 13 also receives frequency switching instructions given to it via line 14. For instance, predetermined frequency switching instructions may be automatically provided in accordance with the computer program. They are given in a synchronous relation to the prevailing clock pulse frequency. Thus, the clock pulse supply is not interrupted at the time of switching clock pulse frequencies, nor does any distortion of the subsequent clock pulse waveforms occur.

Reference numeral 15 designates a counter section, and numeral 16 a distributor. These parts may be provided if necessary. The counter 15 counts clock pulses from the gate circuit 12, and upon detecting a pulse number corresponding to, for instance, the end of one machine cycle, provides a detection output to the clock pulse frequency switching section 13 so as to change the prevailing clock pulse frequency at the end of the machine cycle. The output of the counter section 15 is also coupled to the distributor 16, which also receives clock pulses directly from the gate circuit 12 to distribute clock pulses over a plurality of output lines leading from it. For example, a pulse series consisting of pulses occurring first in the machine cycle, as indicated at TO, is fed to the first output line 17, and a pulse series consisting of *n*-th pulses in the machine cycle, as indicated at Tn, is fed to the *n*-th output line 18. In the computer operation, it is desirable to effect the clock pulse frequency switching at a point between adjacent programmed computer cycles. The point between adjacent programmed computer cycles does not always coincide with the end of the machine cycle. In some computers, the point between adjacent programmed computer cycles corresponds to the mid point in the machine cycle.

Figure 2:
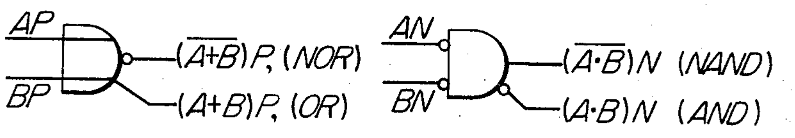
FIG. 2 shows the logic function of the gate circuit.

FIG. 2 shows the logical function of the gate circuit as will be described hereinafter in detail. In the figure, character P at the end of the symbols representing the inputs (such as P in AP) means that the corresponding signal is significant to the gate circuit when it is positive or at a high level, while the character N means that the corresponding signal is significant to the gate circuit when it is negative or at a low level; for example, signal AP is significant when its level is positive or high and signal BN is significant when its level is negative or low.

Figure 3:
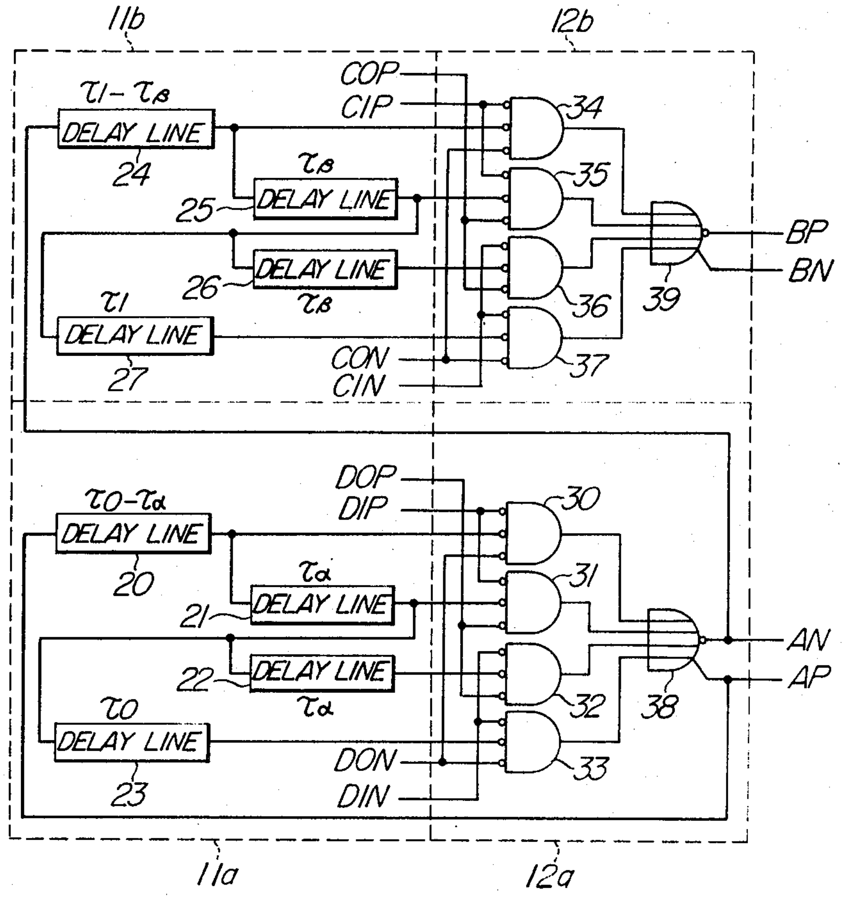
FIG. 3 is a schematic of the oscillator and the gate circuit of FIG. 1.

FIG. 3 shows the oscillator 11 and gate circuit 12 of FIG. 1 in detail. In this circuit, clock pulse series having two different phases A and B are provided. The oscillator 11 consists of two sections 11*a* and 11*b*, and the gate circuit 12 also consists of two sections 12*a* and 12*b*. The first oscillator section 11*a* is coupled with the first gate section 12*a* to determine the oscillation mode or clock pulse frequency, while the second oscillator section 11*b* is coupled with the second gate section 12*b* to determine the phase difference between A and B phase clock pulse signals.

The first oscillator section 11*a* comprises delay lines 20 to 23. The delay line 20 provides a delay time $\tau O - \tau\alpha$ and is connected both to its associated NAND gate 30 and to the delay line 21, which provides a delay time $\tau\alpha$. The delay line 21 is connected to its associated NAND gate 31 and to the delay lines 22 and 23. The delay line 22 provides delay time $\tau\alpha$ and is connected to its associated NAND gate 32. The delay line 23 provides delay time $\tau O$ and is connected to its associated NAND gate 33.

The first gate section 12*a*, which includes the NAND gates 30 to 33, also receives input signals, DOP, D1P, D0N and D1N and selectively provides one of four oscillation modes. The NAND gate 30 provides an oscillation mode with inversion cycle length $\tau O - \tau\alpha$, the NAND gate 31 provides an oscillation mode with inversion cycle length $\tau O$, the NAND gate 32 provides an oscillation mode with inversion cycle length $\tau O + \tau\alpha$, and the NAND gate 33 provides an oscillation mode with inversion cycle length 2 $\tau O$. These NAND gates 30 to 33 are connected to a NOR gate 38, whose OR output is fed through a loop circuit back to the delay line 20. The OR output AP and NOR output AN of the NOR gate 38 are opposite in phase to each other and are represented as phase A signals. These clock pulse outputs AP and AN are delivered to the external circuitry. The output AN is also fed to the second oscillator section 11*b*.

The second oscillator section 11*b* comprises delay lines 24 to 27. The delay line receives the output AN of the NOR gate 38. It provides delay time $\tau 1 - \tau\beta$ and its output is coupled to both its associated NAND gate 34 and to the delay line 25. The delay line 25 provides delay time $\tau\beta$ and its output is coupled to its associated NAND gate 35 and to the delay lines 26 and 27. The delay line 26 provides delay time $\tau\beta$ and its output is coupled to its associated NAND gate 36. The delay line 27 provides delay time $\tau 1$ and its output is coupled to its associated NAND gate 37.

The second gate section 12*b*, which includes the NAND gates 34 to 37, also receives input signals, COP, C1P, CON and C1N for phase switching. The NAND gates 34 to 37 are connected to a NOR gate 39, which provides B phase clock pulse outputs BP and BN.

Figures 4A, 4B, 4C, 4D:
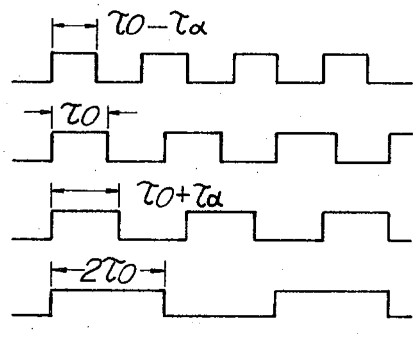
FIGS. 4a–4d are waveform charts showing four clock pulse waves employed.

In operation, if the input signals D1P and D0N are both negative or at a low level, the NAND gate 30 is selected to provide the oscillation mode with inversion cycle length $\tau O - \tau\alpha$ as shown in FIG. 4*a*. If the input signals DOP and D1P are both negative, the NAND gate 31 is selected to provide the oscillation mode with inversion cycle length $\tau O$ as shown in FIG. 4*b*. If the input signals DOP and D1N are both negative, the NAND gate 32 is selected to provide the oscillation mode with inversion cycle length $\tau O + \tau\alpha$ as shown in FIG. 4*c*. If the input signals DON and D1N are both negative, the NAND gate 33 is selected to provide the oscillation mode with inversion cycle length 2 $\tau O$ as shown in FIG. 4*a*.

Figure 5:
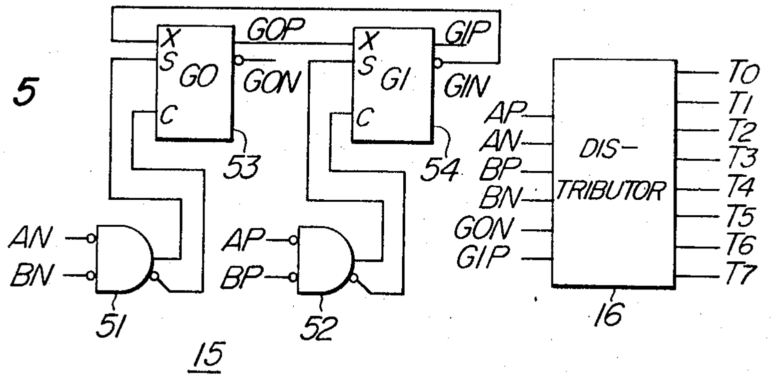
FIG. 5 is a block diagram of the counter and distributor in the system of FIG. 1.

FIG. 5 shows the counter 15 and distributor 16 of FIG. 1 in detail.

Figure 6:
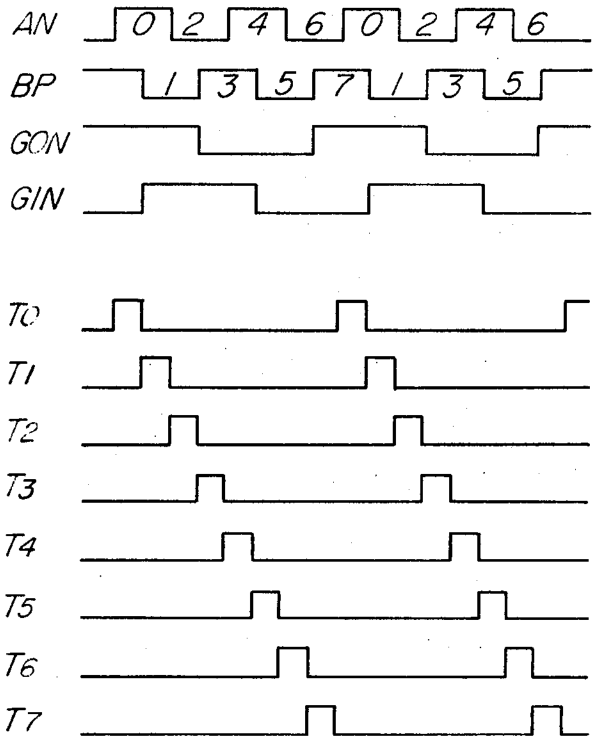
FIG. 6 is a waveform chart to illustrate the circuit of FIG. 5.

FIG. 6 shows a waveform chart illustrating the operation of the circuit of FIG. 5. The timing pulses TO–T7 control the actual operation of the computer. The use of the distributed timing pulses T0–T7, shown in FIG. 6, is a basic condition for computers and is well known, as discussed in the publication "Digital Computer Fundamentals," 1960, written by Thomas C. Barte, published by McGraw-Hill Book Company, Inc., in the section The Operation Decoder, pages 306–314.

The clock pulse outputs AN and BP of the gate circuit 12 are shown for reference; the successive cycles of the output AN are enumerated with even numbers 0 to 6 and those of the output BP are enumerated with odd numbers 1 to 7.

The counter comprises flip-flops GO and G1 which are set if input X is positive or at a high level and set input S becomes positive, and are reset if input X is negative or at a low level and reset input C becomes positive. When the flip-flops GO and G1 are reset, their respective outputs GON and G1N are positive or at a high level.

In this state, therefore, if both the clock pulse signal inputs AN and BN to a NAND gate 51 becomes negative, the NAND output of the NAND gate 51 becomes positive to set the flip-flop GO. For example, the signals AN and BP of FIG. 6 are at their respective states 2 and 3, the output GOP is positive (the output GON is negative).

Similarly, if the clock pulse signal inputs AP and BP to a NAND gate 52 are simultaneously negative, the NAND output of the NAND gate 52 is positive. Thus, when the output GOP is positive, the signal AN is for example at its state 4 and the signal BP is inverted into its state 5, the flip-flop G1 is set.

In the resultant negative state of the output G1N, the flip-flop G0 is reset when both the inputs AN and BN to the NAND gate 51 become positive. In the above manner, the flip-flops GO and G1 are alternately set and reset repeatedly, as is represented by the outputs GON and G1N of FIG. 6.

The clock pulse signals AP, AN, BP and BN and the counter outputs G0N and G1N are coupled to the distributor 16, which provides timing pulse outputs T0 to T7 as shown in FIG. 6.

The pulse period of the pulse outputs T0 to T7 corresponds to one machine cycle in the computer operation. The selection of different oscillation modes also directly affects the timing pulses T0-T7. For example, when the clock pulse frequency is switched from $\tau O$ to 2 $\tau O$, the pulse width of each of the pulses T0–T7 is doubled, so that the repetition frequency of T0–T7 is cut in half. Namely, this occurs because the sources of the timing pulses T0–T7 are the clock pulses AP, AN, BP and BN.

Figure 9:
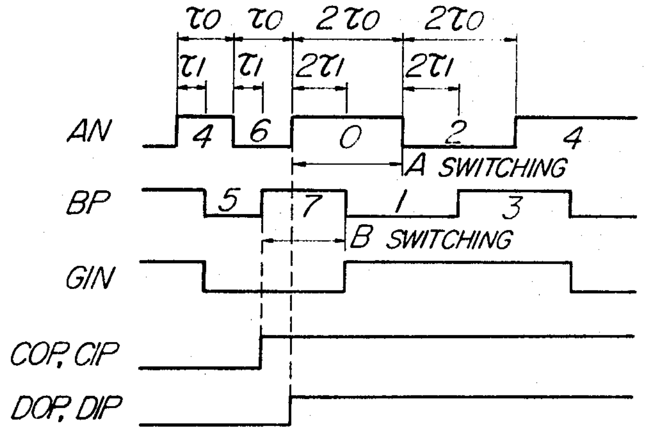
FIG. 9 is a waveform chart to illustrate an example of switching a clock pulse frequency with inversion cycle length $\tau O$ over to the one with inversion cycle length 2 $\tau O$.

The design of distributor 16, shown in FIGS. 1 and 5, which produces signals TO–T7 is within the knowledge of those skilled in the art and, for example, a distributor of the type depicted in FIG. 9–4, shown on page 308 of the above-mentioned "Digital Computer Fundamentals" publication by Barte may be suitably employed therefor. In FIG. 9–4 of the publication, the distributor corresponds to the combination of the counter 15 and the distributor 16 shown in FIG. 1 of the drawings of the present application. As is apparent to those skilled in the art, the only minor difference between the two is that the distributor of the present invention employs counters arranged in two stages and the clock pulses supplied to the distributor are of two phases.

Figure 7:
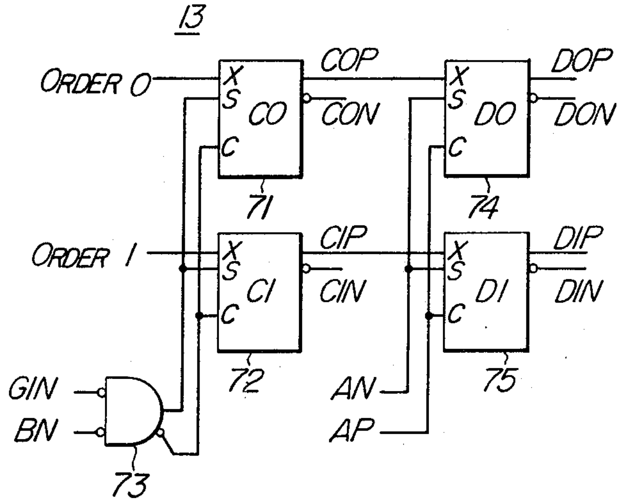
FIG. 7 is a schematic showing the clock pulse frequency switching section of FIG. 1.

FIG. 7 shows the clock pulse frequency switching section 13 in detail. Frequency switching instructions in the form of bi-level order signals 0 and 1 are given to this section. Namely, the orders 0 and 1 are supplied to input terminals X of corresponding flip-flops CO and C1. There are various ways of providing frequency switching orders. It is desirable to provide them in accordance with a computer program. By so doing, it is possible to quickly and automatically confirm the redundancy of the system processing with the clock pulse frequency as a parameter. In this embodiment, two simultaneous signals, namely orders 0 and 1, are given as the frequency switching instructions, in order to switch four oscillation modes or clock pulse frequencies. If a greater number of oscillation modes are necessary, the number of the simultaneous signals may be increased accordingly.

In accordance with this embodiment, the orders 0 and 1 are related to the clock pulse signal as shown in the table below.

Relation between Orders and Clock Pulse Signals

| order 0 | order 1 | Clock Pulse Signal Inversion Cycle Length | Phase Difference |
|---|---|---|---|
| "0" | "0" | $\tau O$ | $\tau 1$ |
| "1" | "0" | $\tau O - \tau\alpha$ | $\tau 1 - \tau\beta$ |
| "0" | "1" | $\tau O + \tau\alpha$ | $\tau 1 + \tau\beta$ |
| "1" | "1" | $2\tau O$ | $2\tau 1$ |

If the orders 0 and 1 are both at level ""0" (low level), the flip-flops CO and C1 remains unset to hold succeeding stage flip-flops D0 and D1 unset. In this state of the flip-flops, their outputs C0P, C1P, D0P and D1P are all negative or at a low level. If the orders 0 and 1 are inverted to level "1" (high level) at an arbitrary instant, the flip-flops C0 and C1 are subsequently set when both the inputs G1N and BN to NAND gate 73 become negative. In other words, the flip-flop outputs C0P and C1P are inverted to the positive or high level at the instant of inversion of the signal BN to the low level. The instant of rendering the outputs C0P and C1N into the high level is optional, but they are preferably inverted at the end of the machine cycle. Thus, in this embodiment the signal G1N is coupled to the NAND gate 73 so that the outputs C0P and C1P may be inverted into the high level upon inversion of the clock pulse signal BN into the low-level state 7.

Figure 8:
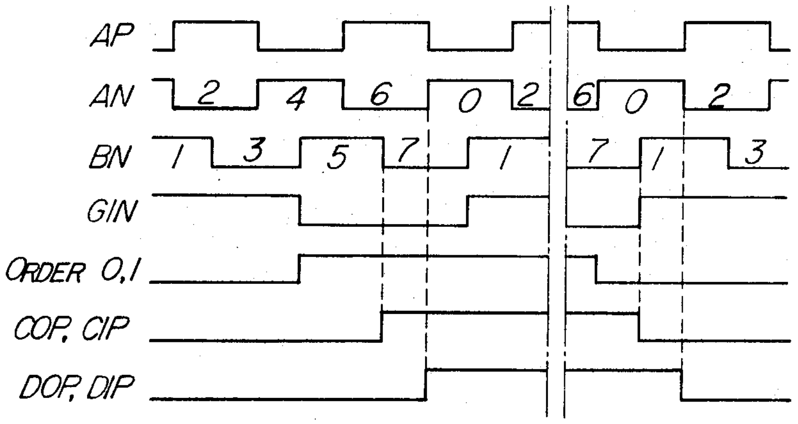
FIG. 8 is a waveform chart to illustrate the operation of the circuit of FIG. 7.

Subsequent to the setting of the flip-flops C0 and C1, the flip-flops DO and D1 are set when the clock pulse signal AN is inverted into the positive or high level, that is, when the waveform of the signal AN becomes insignificant to the gate circuit 12, such as upon inversion of signal AN into state 0 as shown in FIG. 8.

If the orders 0 and 1 are re-inverted to level "0," the flip-flops C0 and C1 are subsequently reset when both the inputs G1N and BN become positive. After the resetting of the flip-flops C0 and C1, the flip-flops DO and D1 are reset at the instant of the subsequent inversion of the clock pulse signal AP. It is to be noted that the resetting of these flip-flops takes place at the end of the machine cycle and at the time when the waveform of the clock pulse signals is insignificant to the gate circuit 12.

Figure 10:
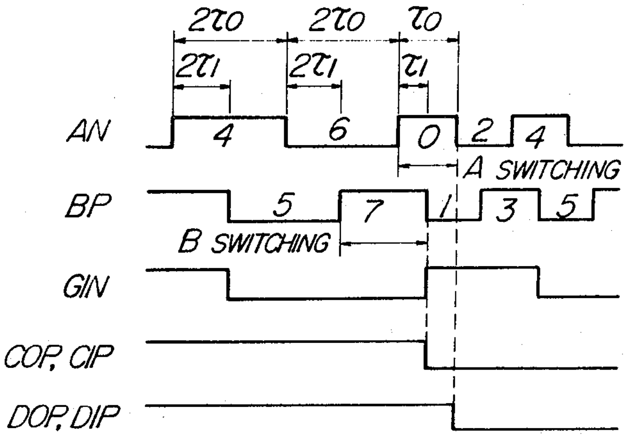
FIG. 10 is a waveform chart to illustrate an example of switching a clock pulse frequency with inversion cycle length 2 $\tau O$ over to the one with inversion cycle length $\tau O$.

FIGS. 9 and 10 show examples of the switching of oscillation modes or clock pulse frequencies. FIG. 9 shows the case of switching the oscillation mode with inversion cycle length $\tau O$ over to the one with inversion cycle length 2 $\tau O$, while FIG. 10 shows the case of switching the oscillation mode with inversion cycle length 2 $\tau O$ over to the one with inversion cycle length $\tau O$.

In the case of FIG. 9, when the orders 0 and 1 are at level "0," that is, when the flip-flop outputs C0P, C1P, D0P and D1P are at the low level, the NAND gates 31 and 35 in the gate circuit 12 of FIG. 3 are selected to provide clock pulse signals AP, AN, BP and BN (only signals AN and BP are shown) with inversion cycle length $\tau O$ and phase difference $\tau 1$. The inversion of the orders 0 and 1 to level "1" leads to subsequent inversion of the signals C0P and C1P to the high level, as is described earlier in connection with FIGS. 7 and 8. Thus, in the second gate section **12*b* the NAND gate 35 is switched over to the NAND gate 37. As is seen, before the switching the signal BP is inverted to the high level state 7 the delay time $\tau 1$ after the inversion of the signal AN, and after the switching the former is inverted to the low level the delay time 2 $\tau 1$ after the inversion of the latter. The signal BP is held in the state 7** for an interval $\tau O + \tau 1$.

After the inversion of the signals C0P and C1P, the signals D0P and D1P are inverted to the high level, switching the NAND gate 31 in the first gate section over to the NAND gate 33. As a result, the inversion cycle length of the signal AN is switched to 2 $\tau O$ from the cycle 0. Thus, new A phase clock pulse signals with inversion cycle length 2 $\tau 1$ and B phase ones with the same inversion cycle length but dephased by 2 $\tau 1$ are obtained. These clock pulse signals continue to prevail so long as the orders 0 and 1 continues to be at level "1."

In FIG. 10, when the orders 0 and 1 are at level "1," that is, when the flip-flop outputs C0P, C1P, D0P and D1P are at the high level, the aforementioned clock pulse signals with inversion cycle length 2 $\tau O$ and phase difference 2 $\tau 1$ prevail. The inversion of the orders 0 and 1 to level "1" leads to subsequent inversion of the signals C0P and C1P to the low level, as is described in connection with FIGS. 7 and 8. Thus, in the second gate section 12*b* the NAND gate 37 is switched over to the NAND gate 35. As is seen, before the switching of the NAND gates the inversion of the signal BP to the high level state 7 $2\tau 1$ after the inversion of the signal AN, whereas after the switching the inversion of the former signal to the low level takes place $\tau 1$ after the inversion of the latter. The signal BP is held in the state 7 for a time $2\,\tau O - \tau 1$.

After the inversion of the signals C0P and C1P, the signals D0P and D1P are inverted to the low level, switching the NAND gate 33 in the first gate section over to the NAND gate 31. As a result, the inversion cycle length of the signal AN is switched to $\tau O$ from the cycle O. Thus, new A phase clock pulse signals with inversion cycle length $\tau O$ and B phase ones with the same inversion cycle length but dephased by $\tau 1$ are obtained.

As has been shown, according to the invention it is possible to switch a plurality of clock pulse oscillation modes without temporarily interrupting the clock pulse supply. Also, the command for the switching of the clock pulse oscillation modes may be given at an optional instant by accordingly preparing the computer program. Further, the switching of the oscillation modes does not cause any disturbance of the waveform of the subsequent clock pulse oscillation, because of the fact that the frequency switching instructions are given in a synchronous relation to the prevailing clock pulse waveform in the time during which the prevailing clock pulse waveform is insignificant to the gate responsible for the switching of the oscillation modes.

We claim:

1. An automatic clock pulse frequency switching system for switching a plurality of clock pulse oscillation frequencies from one into another in a synchronous relation to and without interrupting the prevailing clock pulse oscillation, said system comprising:

an oscillator having a plurality of delay lines and capable of providing a plurality of different oscillation modes;

a gate circuit connected to the output side of said oscillator for selecting one of said oscillation modes of said oscillator, said gate circuit providing an inverse output coupled through a loop circuit back to the input side of said oscillator; and a clock pulse frequency switching section connected to the output side of said gate circuit, said frequency switching section providing a switching command for the switching of oscillation modes to said gate circuit in accordance with external instructions given in a synchronous relation to the prevailing clock pulse oscillation mode, said switching command being delivered during part of the prevailing clock pulse waveform available from said gate circuit during which said prevailing waveform is insignificant to said gate circuit.

2. An automatic clock pulse frequency switching system according to claim 1, wherein said gate circuit includes a plurality of gate means individually corresponding to said respective oscillation modes of said oscillator, said plurality of gate means being selectively switched from one into another in accordance with said switching command from said clock pulse frequency switching section for effecting the switching of oscillation modes.

3. An automatic clock pulse frequency switching system according to claim 1, which further comprises a counter section connected to the output side of said gate circuit, said counter section counting the output clock pulses from said gate circuit to detect a pulse number corresponding to a point between adjacent programmed computer cycles to thereby provide a corresponding detection signal to said gate circuit for the switching of oscillation modes at said point between adjacent programmed computer cycle, said detection signal being delivered during part of the prevailing clock pulse waveform available from said gate circuit during which said prevailing waveform is insignificant to said gate circuit.

4. An automatic clock pulse frequency switching system according to claim 3, wherein said point between adjacent programmed computer cycles is the end of one machine cycle.

5. An automatic clock pulse frequency switching system according to claim 1, wherein:

said oscillator comprises a first oscillator section having a plurality of delay lines to provide a plurality of different oscillation modes and a second oscillator section having a plurality of delay lines to provide a plurality of different phases for any one of said different oscillation modes; and said gate circuit comprises a first gate section connected to the output side of said first oscillator section, said first gate section providing an inverse output coupled back to the input side of said first oscillator section, and a second gate section connected to the output side of said second oscillator section, said first gate section functioning to switch said plurality of different oscillation modes, said second gate section functioning to switch said plurality of different phases, said first and second gate sections being each capable of providing two simultaneous clock pulse signals of the same clock pulse frequency and inverse in phase to each other.

6. An automatic clock pulse frequency switching system according to claim 3, which further comprises a distributor connected to the output side of both said gate circuit and said counter section and having a plurality of output lines, said distributor functioning to distribute clock pulse series from said gate circuit in accordance with said detection signal from said counter section successively over said plurality of output lines one clock pulse timed to the corresponding point between adjacent programmed computer cycles after another.

* * * * *